US008787064B2

(12) United States Patent
Kamins et al.

(10) Patent No.: US 8,787,064 B2
(45) Date of Patent: Jul. 22, 2014

(54) PROGRAMMABLE BIPOLAR ELECTRONIC DEVICE

(75) Inventors: Theodore I. Kamins, Palo Alto, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 259 days.

(21) Appl. No.: 13/130,805

(22) PCT Filed: Jan. 13, 2009

(86) PCT No.: PCT/US2009/030866
§ 371 (c)(1),
(2), (4) Date: May 24, 2011

(87) PCT Pub. No.: WO2010/082923
PCT Pub. Date: Jul. 22, 2010

(65) Prior Publication Data
US 2011/0228592 A1    Sep. 22, 2011

(51) Int. Cl.
*G11C 11/00* (2006.01)
(52) U.S. Cl.
USPC ....................................................... 365/148
(58) Field of Classification Search
CPC  G11C 13/0002; H01L 27/1026; H01L 45/08; H01L 45/1206; H01L 45/14; H01L 45/146
USPC ....................................................... 365/148
See application file for complete search history.

(56) References Cited

U.S. PATENT DOCUMENTS

| 7,203,789 | B2 | 4/2007 | Snider | |
|---|---|---|---|---|
| 2008/0079029 | A1* | 4/2008 | Williams | 257/213 |
| 2008/0090337 | A1 | 4/2008 | Williams | |
| 2011/0073828 | A1* | 3/2011 | Xia et al. | 257/4 |
| 2011/0176353 | A1* | 7/2011 | Li et al. | 365/148 |
| 2011/0188294 | A1* | 8/2011 | Strachan et al. | 365/148 |

OTHER PUBLICATIONS

Sakamoto, Toshitsugu et al.; "Three Terminal Solid-Electrolyte Nanometer Switch"; Electron Devices Meeting, 2005. IEDM Technical Digest. IEEE International; Dec. 2005; 475-478; IEEE; USA.
Sakamoto, Toshitsugu et al.; "NanoBridge Technology for Reconfigurable LSI"; NEC Technical Journal; 2007; 72-75; vol. 2; No. 1.

* cited by examiner

Primary Examiner — Vanthu Nguyen
Assistant Examiner — Khamdan Alrobaie

(57) ABSTRACT

A configurable memristive device (300) for regulating an electrical signal includes a memristive matrix (350) containing a first dopant species; emitter (320), collector (310), and a base electrodes (330, 340) which are in contact with the memristive matrix (350); and a mobile dopant species contained within a central region (360) contiguous with the base electrodes (330, 340), the mobile dopant species moving within the memristive matrix (350) in response to a programming electrical field. A method of configuring and using a memristive device (300) includes: applying a programming electrical field across a memristive matrix (350) such that a mobile dopant species creates a central doped region (360) which bisects the memristive matrix (350); and applying a control voltage to the central doped region (360) to regulate current flow between an emitter electrode (320) and a collector electrode (310).

20 Claims, 5 Drawing Sheets

PROGRAMMABLE BIPOLAR ELECTRONIC DEVICE

BACKGROUND

The presence of dopants within an insulating or semiconducting matrix can dramatically increase the electrical conductivity of the matrix. Dopants can be introduced into a matrix or moved within a matrix to dynamically alter the electrical operation of an electrical device. In some circumstances, the motion of dopants can be induced by the application of a programming electrical field across a suitable doped matrix. After removal of the electrical field, the location and characteristics of the dopants remain stable until the application of another programming electrical field. This phenomenon is most strongly evident in nanometer scale devices and allows the device to "remember" past electrical conditions.

There is a long felt but unfulfilled need for electrical components which retain a memory of past conditions. For example, these electrical components could be self-configured to select a given output, multiplex or de-multiplex a data stream, store data, calibrate circuits, or provide fuzzy logic/neural learning capabilities. A device which is self-configurable by dopant motion and uses voltage or charge carrier injection for fast switching operation is particularly desirable.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1A:
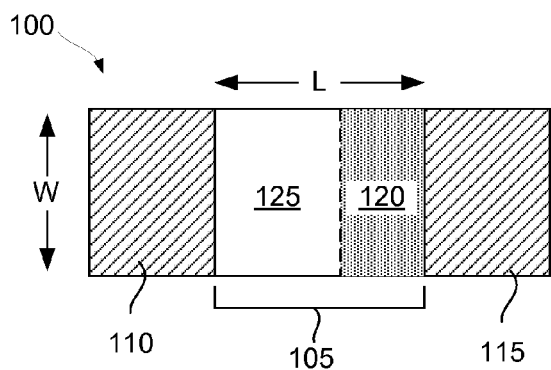
FIGS. 1A-1D are illustrative diagrams which show the fundamental operating principles of a memristive device, according to one embodiment of principles described herein.

The presence of dopants within an insulating or semiconducting matrix can dramatically increase the electrical conductivity of the matrix. Dopants can be introduced into a matrix or moved within a matrix to dynamically alter the electrical operation of an electrical device. In some circumstances, the motion of dopants can be induced by the application of a programming electrical field across a suitable matrix. After removal of the electrical field, the location and characteristics of the dopants remain stable until the application of another programming electrical field.

Throughout the specification and appended claims the term "memristor" or "memristive" is used to describe a matrix/dopant combination which exhibits dopant motion in the presence of a programming electrical field and long-term dopant stability within the matrix when the programming field is removed. This memristive effect is most strongly evident in nanometer scale devices and allows the device to "remember" past electrical conditions.

There is a long felt but unfulfilled need for electrical components which retain a memory of past conditions. For example, these electrical components could be used to store data, calibrate circuits, or provide self-programming, fuzzy logic, or neural learning capabilities. An example of such electrical components may be a solid state memory device with high storage density, no power requirement for long term data retention, and fast access times. Other examples may include: self-configuring switching devices, self-programming circuit elements, memory devices capable of multi-state storage; solid state elements which can be used to tune circuits, analog neuronal computing devices which share fundamental functionalities with the human brain; and electronic devices for applying fuzzy logic processes.

According to one illustrative embodiment, a memristive device may be a programmable resistor or "memristor." A memristor is the fourth fundamental circuit element, joining the capacitor, resistor, and inductor. The term "memristor" is derived from the combination of the two terms "memory" and "resistor." The memristor has properties that cannot be duplicated by the combination of the other fundamental circuit elements. Unlike the other fundamental circuit elements, the memristor carries a memory of past electrical fields which have been applied. As described in U.S. Patent App. Pub. No. 20080079029, entitled "Multi-terminal Electrically Actuated Switch" to R. Stanley Williams, which is hereby incorporated in its entirety, memristor devices are based on dopant motion within a matrix material. Specifically, when an electrical field of sufficient magnitude is applied to a memristor, the dopants within the matrix material are displaced. When the electrical field is removed from the circuit, the displacement of the dopants allows the memristor to "remember" how much voltage was previously applied and for how long. The motion of these dopants alters the electrical resistance of the memristor. The dopants remain in this displaced state over long periods of time, thereby retaining a memory of the past electrical fields applied to the device. Until another electrical field is applied to the memristor which has sufficient intensity or duration to induce dopant motion, the resistance characteristics of the memristor are stable.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

A multi-electrode memristive device may be designed which operates in at least two different configurations. When a mobile dopant species is contained within the memristive matrix, the memristive device may switch or modulate electrical signals by moving dopants through the memristive matrix. By introducing another dopant species that imparts an opposite conductivity type, the memristive device may be reconfigured to operate as a transistor. This allows for rapid switching and modulation of current through the application of a control voltage rather than motion of dopants. The flexibility of the multi-electrode memristive device provides a number of advantages such as the ability to reconfigure electronic hardware, recover from system degradation, and optimize an electronic system's performance in a given situation. This flexibility can also provide the ability for the system to learn over time, apply fuzzy logic in hardware, and create hardware-based neural networks. The long term stability of the dopants within the memristive matrix allows the system to preserve its configuration and provide "instant on" operation.

FIG. 1A shows an illustrative two-terminal memristive switch (100). According to one embodiment, the two-terminal memristive switch (100) is comprised of a first electrode (110) and a second electrode (115) which are in electrical and physical contact with the memristive matrix (105). Throughout the specification and appended claims, the term "memristive matrix" describes a thin film of a material that is electronically semiconducting or nominally electronically insulating and also a weakly ionic conductor. The memristive matrix is capable of transporting and hosting ions that act as dopants to control the flow of electrons and/or holes through the switch. The basic mode of operation is to apply an electrical field (the drift field, which may exceed some threshold for enabling the motion of the ions in the primary material) across the switch large enough to cause an ionic species to be transported within the memristive matrix via ionic transport. The ionic species are specifically chosen from those that act as electrical dopants for the memristive matrix, and thereby change the electrical conductivity of the matrix from low conductivity (i.e. an undoped semiconductor or insulator—switch-OFF configuration) to high conductivity (doped to provide a higher conductivity—switch-ON configuration) or from high electrical conductivity to low conductivity (switch-ON to switch-OFF). Furthermore, the memristive matrix and the dopant species are chosen such that the drift of the dopants within the memristive matrix is possible but not too facile, to ensure that the switch will remain in whatever state it is set for a reasonably long time, perhaps many years at room temperature and without an electric drift field above the critical field needed for programming. This ensures that the switch is nonvolatile, that is, that it holds its state after the drift field has been removed.

According to one embodiment, the memristive matrix (105) is made up of two portions: an intrinsic (not intentionally doped) portion (125) and a doped portion (120). Migration of the dopants from the doped portion (120) converts at least a part of the intrinsic portion (125) into an additional part of the doped portion (120) and increases the overall electrical conductivity of the device. Illustrative examples of suitable memristive combinations are given in Table 1, below. The table lists compatible intrinsic materials, doped materials, and dopant species for each of the memristive combinations.

TABLE 1

Examples of Compatible Memristive Combinations

| Intrinsic Material | Doped Material | Dopant Species |
|---|---|---|
| $TiO_2$ | $TiO_{2-x}$ | Oxygen Vacancies |
| $ZrO_2$ | $ZrO_{2-x}$ | Oxygen Vacancies |
| $HfO_2$ | $HfO_{2-x}$ | Oxygen Vacancies |
| $SrTiO_3$ | $SrTiO_{3-x}$ | Oxygen Vacancies |
| GaN | $GaN_{1-x}$ | Nitrogen Vacancies |
| CuCl | $CuCl_{1-x}$ | Chlorine Vacancies |
| GaN | GaN:S | Sulfide Ions |

Applying a high voltage across the electrodes (110, 115) causes both electron current to flow and dopant motion through the matrix material, whereas at a low voltage bias the dopant motion is negligible, which allows the characteristics of the memristor to remain unchanged.

These dopants may be impurity atoms such as hydrogen or some other cation species, such as alkali or transition metals, which act as electron donors for the matrix material. Additionally or alternatively, the dopants may be anion vacancies, which act as donors within the matrix. It is also possible to drive anionic species into the matrix material, which will become electron acceptors (or holes). The matrix material may be a thin film (generally less than 50 nm thick), and is in many cases nanocrystalline, nanoporous, or amorphous. In general, the mobility of the dopant species can be much higher in nanostructured materials than in a bulk crystalline material, since diffusion can occur through grain boundaries, pores, or through local structural imperfections in an amorphous material. Also, because the film is so thin, the amount of time required to drift enough dopants into or out of a local region of the film to substantially change its conductivity is relatively rapid over short distances. Another advantage of nanometer scale memristive devices is that a large electrical field can be produced by a relatively small applied voltage. For example, a dopant may require an electrical field intensity of 100,000 volts per centimeter to move within the matrix. If the distance between two electrodes is 100 nanometers, a voltage bias of only 1 Volt will produce the required electrical field intensity. The drift rate of dopants typically increases as the temperature of the memristive device increases. Consequently the effect of an applied electrical field could be enhanced by heating the memristive device.

As noted above, the matrix material has certain properties that are useful in the practice of the present invention. One of these properties of the material is that it is a weakly ionic conductor. The definition of a weakly ionic conductor is based on the application for which a memristive device is designed. The mobility and the diffusion constant for a species in a lattice are directly proportional to one another, via the "Einstein relation". Thus, if the mobility of ionized species in a lattice is very high, so is the diffusion constant. In general, it is desired for a memristive device to stay in a particular state, such as a programmed configuration, for an amount of time that may range from a fraction of a second to years, depending on the application. Thus, the diffusion constant for such a device is, in an embodiment, low enough to ensure the desired level of stability, to avoid inadvertently reconfiguring the device via ionized species diffusion, rather than by intentionally setting the state of the memristive device with a voltage pulse. Therefore, a "weakly ionic conductor" is one in which the ion mobility, and thus the diffusion constant, is small enough to ensure the stability of the device configuration for as long as necessary under the desired conditions (e.g., the device does not change state because of diffusion of the dopants). "Strongly ionic conductors" would have large ionized species mobilities and thus would not be stable against diffusion.

As discussed above, the memristive matrix (105) may be initially comprised of two separate portions, an intrinsic portion (125) and a doped portion (120). The intrinsic portion (125) is has very few dopants and prevents electrical current from flowing between the two electrodes (110, 115). The second doped portion (120) is conductive and also serves as a source of dopants which can be moved into the intrinsic portion (125) to change the overall electrical conductivity of the memristive matrix (105). Consequently, in the configuration illustrated in FIG. 1A the memristive switch (100) is open.

According to one illustrative embodiment, the intrinsic portion (125) is comprised of intrinsic titanium dioxide ($TiO_2$). Intrinsic titanium dioxide ($TiO_2$) is an insulator, having a resistivity of approximately $10^{12}$ ohm centimeter at 25° C. The second highly doped layer (120) is comprised of oxygen deficient titanium dioxide ($TiO_{2-x}$), where the subscript "x" indicates that the titanium dioxide has a small deficit of oxygen atoms in the crystal structure. These positively charged oxygen vacancies are the dopants in this embodiment. Even relatively low concentrations of oxygen vacancies (below 2%) result in a large increase of the electrical conductivity within the titanium dioxide. The oxygen vacancies act as electron donors, thus $TiO_{2-x}$ is an n-type semiconductor. Additionally, the oxygen vacancies move within the titanium dioxide under the influence of electrical fields. For example, electrical fields between 10,000 volts per centimeter and 100,000 volts per centimeter may be sufficient to physically relocate the oxygen vacancies.

The memristive matrix (105) has a length of "L" and a width of "W" as shown in FIG. 1A. For purposes of illustration only, assume that the length "L" is 100 nanometers and the width "W" is approximately 50 nanometers. Consequently, to apply an electrical field of 100,000 volts/centimeter across the memristive material (105), a voltage bias of 1 volt would be applied across the electrodes (110, 115).

The dopants may originate from a variety of sources. The matrix material may be initially formed with a number of dopants distributed throughout the matrix. A programming electrical field can then be used to displace the dopant to form intrinsic regions and doped regions within the matrix. In other embodiments, the matrix material may be deposited in its intrinsic form. A sacrificial layer is then deposited onto the intrinsic material which provides the dopants by chemically reacting with the intrinsic matrix. For example, a layer of intrinsic titanium dioxide may be deposited, followed by a layer of aluminum. The elemental aluminum has a high affinity for oxygen molecules and will chemically combine with a number of oxygen molecules which were previously bound within the titanium dioxide matrix, thereby creating aluminum oxide. This creates oxygen vacancies within the titanium dioxide matrix. The oxygen vacancies then act as dopants within the titanium dioxide matrix. The aluminum/aluminum oxide layer can be then be striped from the matrix. In other embodiments, the aluminum may remain within the memristive device or be used as an electrode.

In an alternative embodiment, the initial doping may be accomplished by directly depositing the doped secondary material (120) during the manufacturing process. The application of a programming electrical field to the memristive device then allows the dopants contained within the secondary material (120) to be distributed as desired throughout the matrix.

Additionally, a passivation layer may be formed over a memristive device to prevent atmospheric oxygen or other contaminants from chemically altering the composition of the memristive device. For example, if a passivation layer is not present, an oxygen deficient titanium dioxide matrix may lose dopants over time as a result of atmospheric oxygen filling the oxygen vacancies.

The electrodes (110, 115) may be constructed from a variety of conducting materials, including but not limited to: metals, metal alloys, highly doped semiconductors, composite materials, nanostructured materials, or other suitable materials. According to one illustrative embodiment, the electrodes are formed from platinum.

Figure 1B:
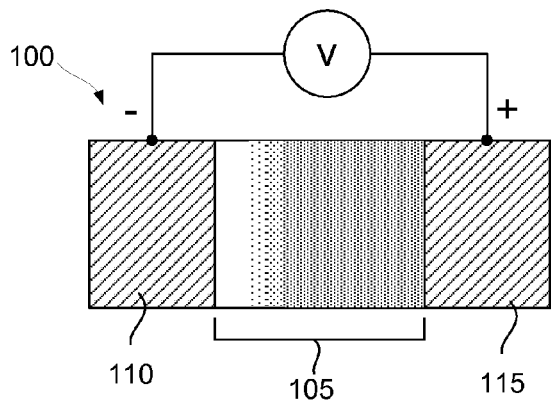

FIG. 1B illustrates the movement of the oxygen vacancies from the highly doped secondary region (120) into the intrinsic primary region (125) as a result of an applied electrical field. The polarity and voltage difference which is applied across the memristive matrix (105) may vary according to a variety of factors including, but not limited to: material properties, geometry, dopant species, temperature, and other factors. Where titanium dioxide is used as the matrix, the oxygen vacancies have a positive charge, consequently a positive voltage is applied to the right electrode (115) to repulse the oxygen vacancies and drive them toward the left electrode (110).

Figure 1C:
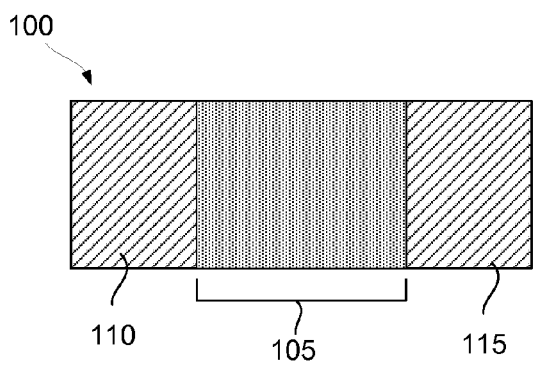

FIG. 1C illustrates the memristive switch in the fully "ON" position, with the dopants fully distributed throughout the memristive matrix (105). The left and right electrodes (110, 115) are electrically connected and can pass lower voltage electrical signals through the memristive matrix (105). As discussed above, the location and distribution of the dopants can remain stable over long periods of time or until another programming voltage is applied. The memristive matrix (105) is not a perfect conductor and still interposes an electrical resistance between the two electrodes (110, 115) in the fully "ON" state. This electrical resistance may be influenced by a variety of factors, including, but not limited to the geometry of the memristive matrix and the electrodes, the dopant concentration, the distribution of the dopants throughout the memristive matrix, the species of dopant, the electrical characteristics of the matrix material, the temperature of the device, and other factors.

Figure 1D:
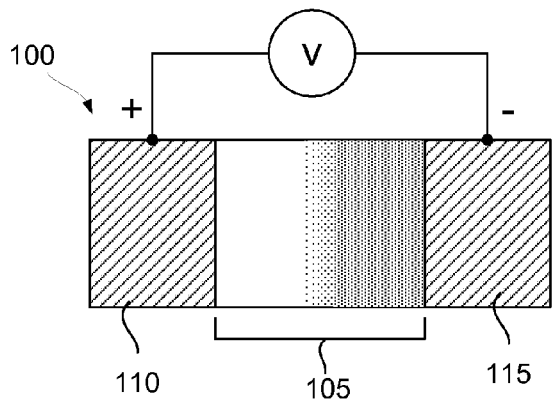

FIG. 1D illustrates the application of another programming voltage to the memristive switch (100). In this case, the purpose of the programming voltage is to return the memristive switch (100) to the fully "OFF" configuration similar to that illustrated in FIG. 1A. Consequently, the applied programming voltage has an opposite polarity from that illustrated in FIG. 1B. A positive voltage is applied to the left electrode (110) and negative voltage is applied to the right electrode (115), thereby driving the dopants to toward the right electrode (115). This returns the left most portion of the memristive matrix (105) to its intrinsic and insulating state. The memristive switch (100) is then in a fully "OFF" configuration.

The transition from the fully "OFF" to fully "ON" configuration or visa versa, is not instantaneous, but can have a number of intermediate states in which the memristive matrix acts as a finite resistance between the two electrodes. These intermediate states may be produced by varying the programming voltage applied across the two electrodes (110, 115) and/or varying the time period during which the programming voltage is applied.

In some circumstances, it can be desirable to for the memristive matrix to retain some electrical resistance. For example, in the fully "ON" configuration illustrated in FIG. 1C, if the resistance of the memristive matrix (105) is negligible, the two electrodes (110, 115) and the memristive matrix (105) can be thought of as a single electrical conductor. The application of a programming voltage across the two electrodes (110, 115) results in a large flow of current through the switch, but very low voltage difference between the two electrodes (110, 115). Consequently, the electrical potential gradient between the left and right electrodes (110, 115) is small, making it very difficult to move the dopants away from either electrode. This would result in the memristive switch (100) being permanently stuck in a fully "ON" or short circuited configuration.

A number of additional electrodes and memristive geometries could be used. For example, three or more electrodes could be in electrical contact with a memristive matrix.

Figure 2A:
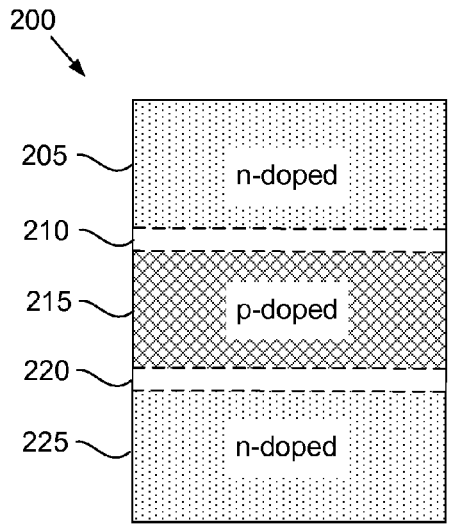
FIGS. 2A and 2B are diagrams which illustrate the basic structure and function of a semiconducting transistor, according to one embodiment of principles described herein.
Figure 2B:
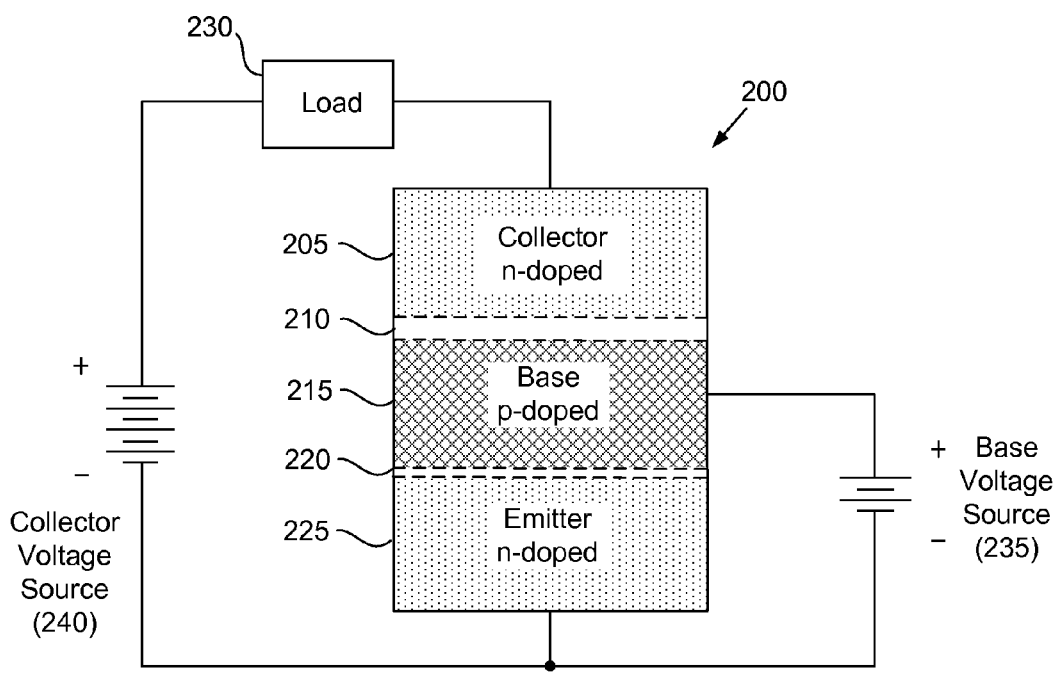

According to one illustrative embodiment, a memristive device may be reconfigurable from a resistive device which operates on dopant motion into a transistor which is configured to rapidly modulate electrical fields using a control voltage. FIGS. 1A-1D illustrate the basic principles of a resistive device which operates on dopant motion. FIGS. 2A and 2B illustrate the basic configuration and operating principles of a transistor.

FIGS. 2A and 2B are diagrams of an NPN structure and an NPN transistor, respectively. The NPN structure contains two junctions and is created by forming three layers of doped semiconductor. The top and bottom layers are n-doped and the center layer is p-doped.

Semiconductors doped with donor impurities are called n-doped materials. These n-type impurities typically donate weakly-bound electrons to the material and create an excess of negative charge carriers. These weakly-bound electrons can move within the matrix material relatively freely and increase the electrical conductivity of the material.

For example, in a titanium dioxide matrix, adding beryllium atoms can turn a titanium dioxide material into an n-doped semiconductor. When the beryllium atoms are implanted into the titanium dioxide material they may form one or more bonds with the surrounding titanium dioxide molecules. However, after making the bonds, the beryllium has one extra electron which is not included in any bond. This is a weakly-bound electron which can move within the matrix and dramatically increases the electrical conductivity of the matrix.

Another possible n-type dopant for titanium dioxide is an oxygen vacancy. Titanium dioxide is a stable molecule in which the titanium atom shares one of its two valence electrons with each of the oxygen molecules to form a covalent bond. As discussed above, to create an oxygen vacancy, an oxygen atom is removed from a titanium dioxide molecule. After removal of oxygen, the titanium has a free electron which does not participate in any covalent bond. This free electron acts as a negative charge carrier and dramatically increases the electrical conductivity of the oxygen deficient titanium dioxide.

Semiconductors doped with acceptor impurities are called p-doped materials. The p-type impurities produce a hole (the absence of an electron in the valence band), which also increases the electrical conductivity of the doped material. Examples of dopants which can turn titanium dioxide into a p-type semiconductor include magnesium and calcium.

FIG. 2A shows an illustrative NPN structure (200). The top and bottom layers (205, 225) are n-doped layers which have an excess of free electrons. The center layer (215) is a p-doped layer which has an excess number of holes (or electron acceptor sites). At the interfaces between the p-doped and n-doped regions, depletion zones (210, 220) are formed. A depletion zone is an insulating region created when free electrons from the n-doped layers (205, 225) "fall into" the holes within the p-doped layer (215). The combination of the free electrons with the holes depletes the region of charge carriers and creates an insulating layer at the junctions of the two different materials. The depletion zone reaches equilibrium by repelling holes back into the p-layer and electrons back into the n-layer because of the electric field and the potential barrier created by the uncompensated net charge of the dopant atoms within the depleted region.

FIG. 2B shows an NPN structure (200) being used as a transistor. Transistors are used to amplify or switch electronic signals and are fundamental and ubiquitous components within modern electronic devices. FIG. 2B illustrates a bipolar junction transistor. When combined with capacitors, resistors, diodes, and other electronic components, transistors can be used to form complete electronic circuits.

In the illustrative embodiment shown in FIG. 2B, the NPN structure is connected to external components to form a functional transistor circuit. The top n-doped layer (205) is named the "collector," the bottom n-doped layer (225) is named the "emitter," and center p-doped layer (215) is named the "base." Before the application of a base voltage (235), the depletion zones (210, 220) act as insulators which prevent the flow of current through the NPN structure (200). The application of a relatively small base voltage (235) narrows the lower depletion zone (220) between the base and the emitter, by pushing the electrons in the n-doped layer (225) toward the p-doped base (215). As the base voltage is increased, the depletion zone (220) becomes so thin that large numbers of electrons flow from the n-doped emitter into the p-doped base (215). This flow of electrons continues through the base region (215) until they reach the upper depletion zone (210). The upper depletion zone (210) serves to isolate the base of the NPN structure from the collector voltage. As free electrons approach the upper surface of the base layer (215), they are forcibly transferred across the upper depletion region (210) by the relatively high collector voltage (240).

Consequently, the lower depletion zone (220) acts as an electronically controlled "valve" which opens proportionally to the applied base current. The NPN structure (200) can be used as either a proportional amplifier or a switch or both. A small amount of base current is proportionally translated into a large amount of current flow from the emitter to the collector. Transistors can be switched very rapidly from an "OFF" to an "ON" state by changing the base voltage. The larger the base voltage and current, the thinner the lower depletion zone, and the higher the amount of current that flows through the entire NPN structure. At a certain base voltage threshold, the NPN structure reaches its fully conductive state and a very large flow of electrical charges pass through the NPN structure (200) and load (230) and then returns to the collector voltage/current source.

A multi-electrode memristive device can be configured to act as a self-configuring transistor device. In a first configuration, the memristive device can be configured to act as a resistive device which switches and modulates electrical currents based on dopant diffusion through a memristive matrix. As discussed above, the resistive device "remembers" past applications of electrical fields and can be used to store data, selectively connect electrodes, tune circuits and other functions.

Figure 3A:
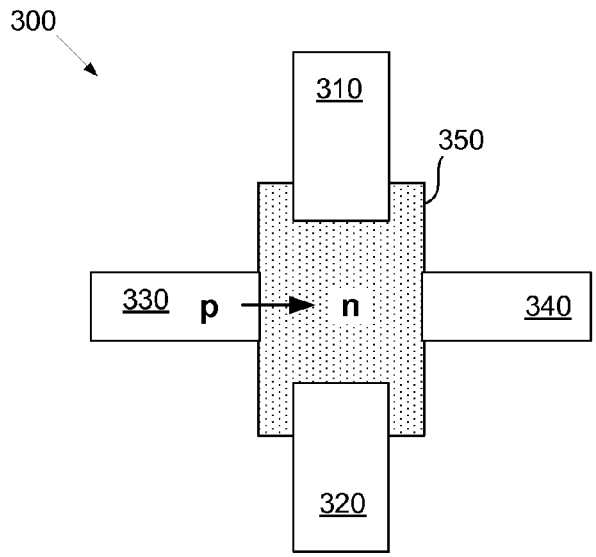
FIGS. 3A and 3B are illustrative diagrams of a planar memristive transistor, according to one embodiment of principles described herein.

FIG. 3A shows a memristive matrix (350) which is surrounded by four electrodes (310, 320, 330, 340). As discussed above with respect to Table 1, a variety of materials could be used to form the memristive matrix. According to one illustrative embodiment, the memristive matrix (350) may be titanium dioxide which contains an n-type dopants such as oxygen vacancies or beryllium dopants.

As discussed above, the electrodes (310, 320, 330, 340) may be formed from a variety of materials such as metals, metal alloys, highly doped semiconductors, composites, or nanostructured materials. The individual electrodes (310, 320, 330, 340) need not be formed from same materials as the other electrodes (310, 320, 330, 340), but could be formed from a number of diverse materials as best suits a given situation.

According to one illustrative embodiment, the configuration of the memristive device (300) shown in FIG. 3A could serve a variety of functions without the diffusion of the p-dopants into the memristive matrix. For example, if the n-dopant was mobile within the memristive matrix, electrical fields could be applied which would change the distribution of the n-dopant within the matrix. Regions which do not contain n-dopants would be electrically insulating and regions which contain a relatively high concentration of the n-dopants would be electrically conductive. As described in U.S. Patent App. Pub. No. 20080079029, entitled "Multi-terminal Electrically Actuated Switch" to R. Stanley Williams, which was previously incorporated by reference, the n-dopants can be displaced to form a conductive and reconfigurable path between two or more electrodes. This allows connections between two or more electrodes to be selectively made. Further, by varying the concentration of the dopants within the conductive path, the electrical resistance of the connection can be changed. This can provide selective tuning of the external component or circuits. Once the mobile dopants are at the desired location, the programming electrical field can be removed. The mobile dopants then remain in place until another programming electrical field is applied.

A fundamental limitation of the switching, routing, and tuning operations performed by displacing mobile dopants within a memristive matrix is that it takes time for the mobile dopants to be physically moved from one location to another. This can lead to relatively slow switching times. However, by injecting p-dopants into an n-doped memristive matrix, a transistor can be formed. As discussed above, a control voltage applied from the base to the emitter can then control the current conduction of the transistor. The changes to the control voltage can be made very rapidly, resulting in fast switching times within a transistor.

According to one illustrative embodiment, the left electrode (330) may introduce a number of mobile p dopants into the memristive matrix. By applying a programming voltage of the proper polarity between the left electrode (330) and the right electrode (340), an electrical field of sufficient intensity moves the mobile p dopants into the memristive matrix as indicated by the arrow. The source of mobile p dopants may be the left electrode itself. For example, the left electrode may be highly doped with the p dopant species. Additionally or alternatively, the source of the mobile p dopants may be from a separate reservoir layer or material that is in front of or internal to the left electrode.

Figure 3B:
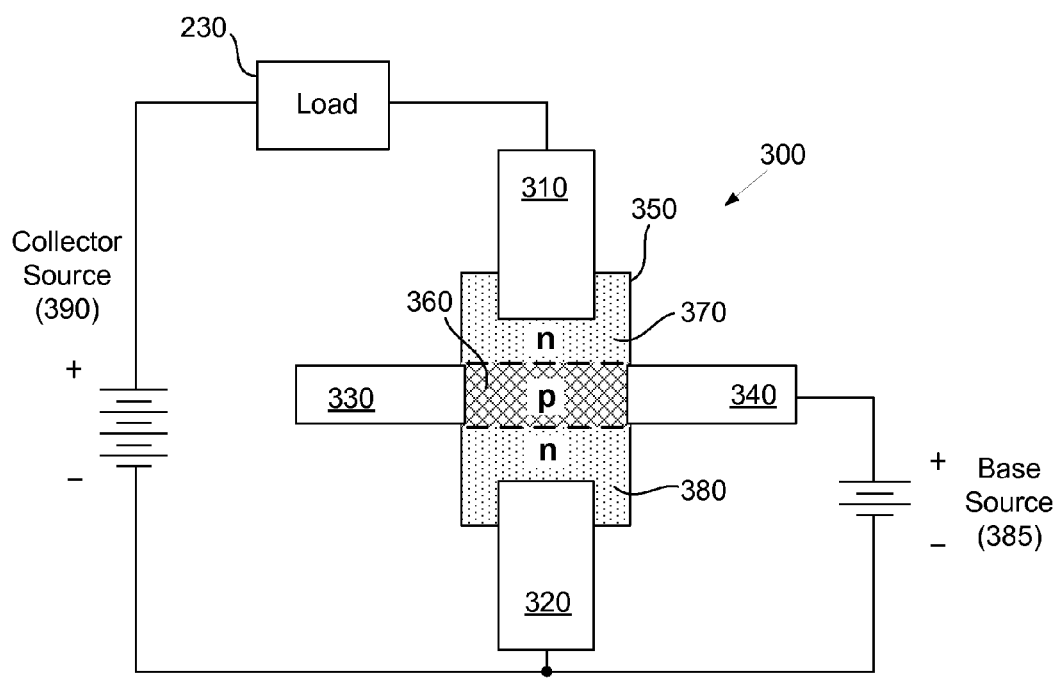

FIG. 3B shows a band of p-dopants (360) which has been extended from the left electrode (330) to the right electrode (340) which configures the memristive device (300) to act as transistor. Electrical field from one or more of the four electrodes (310, 320, 330, 340) can be used to shape the band of p-dopants (360). By way of example and not limitation, the upper and lower electrodes (310, 320) may be used to influence the width of the band of p-dopants (360) and the left and right electrodes (330, 340) may influence the dopant concentration and horizontal distribution. The n-dopants within the memristive matrix may or may not be displaced during the creation of the band of p-dopants (360). According to one illustrative embodiment, the n-dopants may remain within the p-doped band (360). In this case, the influence n-dopants within the p-doped band will be cancelled by the presence of p-dopants. The overall electrical character of the p-doped band (or any doped region) is determined by the net difference between the number of n-dopants and p-dopants. By injecting a large number of p-dopants, the influence of the n-dopants can be overwhelmed, thereby producing a net p-type performance of the p-doped band. Additionally or alternatively, at least a portion of the n-dopants may be moved out of the p-doped band. The n-dopants have an opposite electrical charge from the p-dopants. Consequently, electrical fields which have a tendency to attract p-dopants will repel n-dopants, and visa versa. The electrical field applied between the left electrode and right electrode to inject the p-dopants may have a tendency to repel n-dopants. The species of n and p dopants could be chosen such that the desired displacements occur. For example, an n-dopant may be selected which requires a relatively high electrical field to move within a given memristive matrix. A p-dopant species which requires a lower electrical field to move within the memristive matrix may be selected. Consequently, the p-dopant species may be introduced into the memristive matrix to form the p-doped band (360) without disturbing the n-dopant distribution.

The band of p-dopants (360) is configured such that it divides the n-doped matrix into two distinct n-doped regions, an upper region (370) and a lower region (380). By interposing the band of p-dopants (360) between the two n-doped regions (370, 380), an NPN structure is formed which can function as a transistor. In transistor operation, the lower n-doped region (380) may be the emitter, the dopant band (360) may be the base, and the upper n-doped region (370) may be the collector.

The operation of the transistor is then substantially similar to the conventional transistor described in FIGS. 2A and 2B. The base voltage is provided by the base source (385) and applied to the p-doped band (360) by the right electrode (340). Additionally or alternatively, the base voltage (385) could be applied to both the right and left electrodes (330, 340). This base voltage can be selectively varied to adjust the thickness of the depletion zone between the p-doped band (360) and n-doped emitter (380). Consequently, the variation in base current is amplified into large current flows through the memristive transistor (300) from lower electrode (310) to the upper electrode (320). The operation of the memristive transistor (300) can exhibit speed and switching capabilities comparable to a conventional transistor.

As discussed above, the memristive device can dynamically alter its characteristics by moving dopants within the memristive matrix (350). For example, the memristive device could switch back and forth between its resistive state (FIG. 3A) and its transistor state (FIG. 3B). This could be accomplished by withdrawing central doped region by applying a programming electrical field which moves the mobile dopants to one side of the memristive matrix.

Additionally, the memristive device could fine tune its operation within either of the two states by changing dopant locations. For example, in its resistive state, the memristive device could electrically connect the bottom electrode (320) to the right electrode (340) by pushing the n-type dopants to the lower right hand corner of the memristive matrix. This would result in a high conductivity connection between the bottom electrode (320) and the right electrode (340) while simultaneously electrically isolating the remaining two electrodes. In another embodiment, the n-type dopants could be compressed into a band that extends across the memristive matrix either horizontally or vertically. This would allow connections to be made between the left and right electrodes (330, 340) or the top and bottom electrodes (310, 320).

In its transistor state, the memristive device can alter its performance in a variety of ways. For example, the thickness of the doped regions can be adjusted, which may significantly influence the operation of the transistor and allow it to be customized "on the fly" to match the requirements of a given situation. For example, the breakdown voltage and current leakage of a transistor are influenced by the dopant concentration and thickness of the doped regions.

As a result of the ability to self-configuration these memristive devices, significant flexibility can be incorporated into a variety of systems. For example, systems can be made to be self healing or adapt to a given situation. Further because of the stability of the memristive devices, the systems can retain their optimized configuration over long time periods and during a loss of power.

Figure 4A:
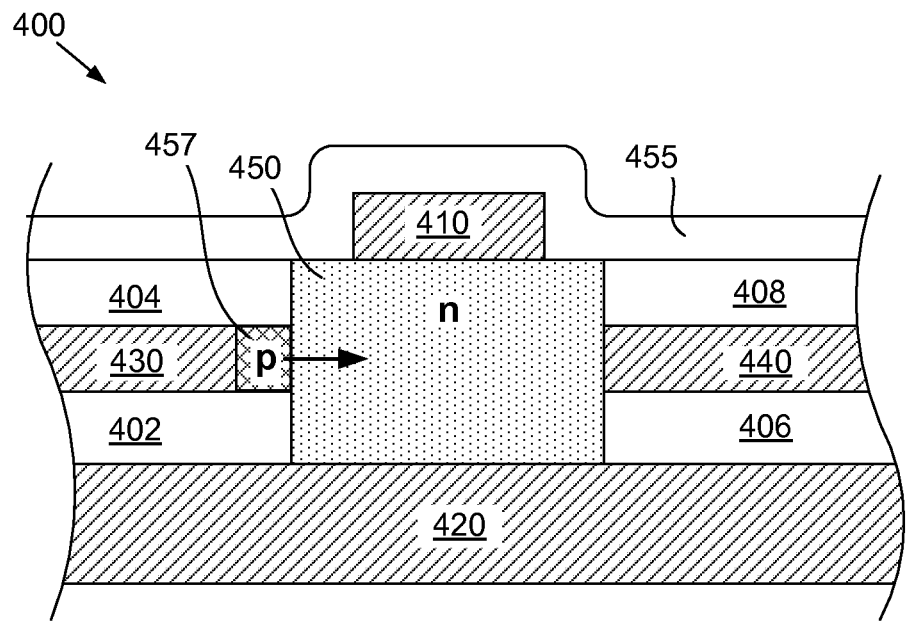
FIGS. 4A and 4B are cross-sectional diagrams of an illustrative vertically constructed transistor, according to one embodiment of principles described herein.
Figure 4B:
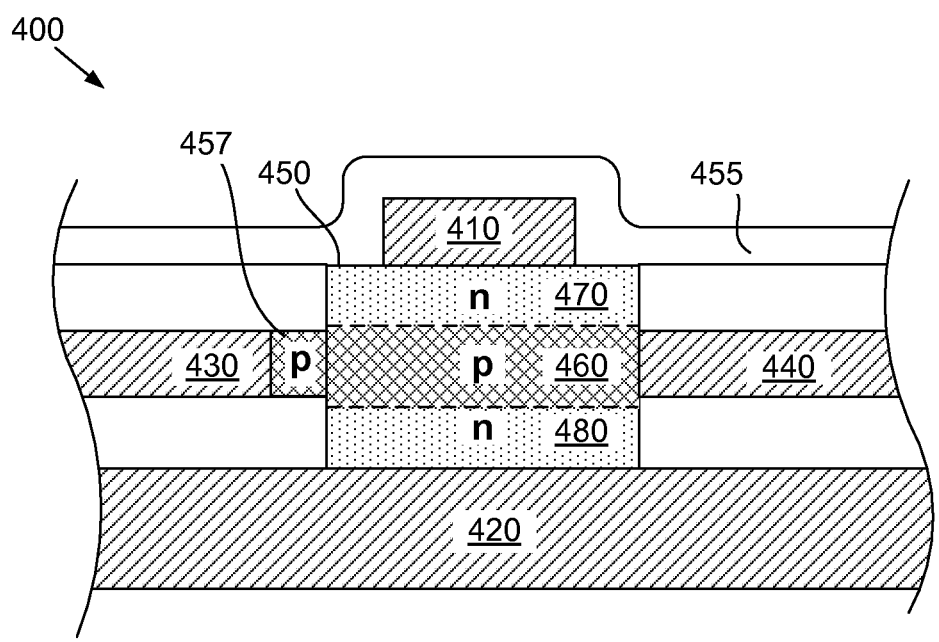

FIGS. 4A and 4B are cross-sectional diagrams of a vertical implementation of an illustrative memristive device (400). FIG. 4A shows memristive device (400) in its resistive form. The memristive device (400) includes a memristive matrix (450) which has been formed on a bottom electrode (420). Lower insulating layers (402, 406) are also formed on the bottom electrode (420). These lower insulating layers (402, 406) electrically separate the left electrode (430) and the right electrode (440) from the bottom electrode (420). Additional insulating layers (404, 408) are formed on top of the left and right electrodes (430, 440). For convenience of illustration, insulating layers are shown as two distinct regions separated by the memristive matrix (450). However, in a three dimensional implementation, the insulating layers may not be separate. Rather a single layer may surround the memristive matrix (450). A top electrode (410) is formed above the memristive matrix (450). According to one embodiment, a passivation layer (455) is formed over the memristive transistor (400) to prevent the entry of contaminants or unwanted dopants. For example, if the memristive matrix (450) is made up of oxygen deficient titanium dioxide, exposure to atmospheric oxygen can reduce the dopant concentration. Atmospheric oxygen combines with the oxygen vacancies to create stoichiometric titanium dioxide, which is an electrical insulator. This would disrupt the function of the memristive device (400).

According to one illustrative embodiment, p-dopants may be stored in a reservoir (457). This reservoir (457) may be any material which is configured to hold dopants until they are released through the application of a programming electrical field. In some embodiments, the dopants may be returned to the reservoir (457) to reconfigure the memristive device from a transistor configuration back to a resistive configuration.

FIG. 4B shows a band of p-dopants (460) which has been extended from the left electrode (430) to the right electrode (440). According to an illustrative embodiment, a voltage bias between the left electrode (430) and right electrode (440) creates an electrical field which displaces the p-dopants from the reservoir (457) into the memristive matrix (450). The p-doped band (460) extends across the entire width of the memristive matrix (450) and creates two separate n-doped regions (470, 480). As discussed above, electrical fields generated by one or more of the four electrodes (410, 420, 430, 440) can be used to shape the band of p-dopants (460). By way of example and not limitation, the upper and lower electrodes (410, 420) may be used to influence the width of the band of p-dopants (460) and the left and right electrodes (430, 440) may influence the dopant concentration and horizontal distribution.

As discussed above, the band of p-dopants (460) is configured such that it divides the n-doped matrix into two distinct n-doped regions, an upper region (470) and a lower region (480). By interposing the band of p-dopants (460) between the two n-doped regions (470, 480), an NPN structure is formed which can function as a transistor. In transistor operation, the lower electrode (420) may be the emitter, the dopant band (460) and either or both of the adjacent electrodes (430, 440) may serve as the base, and the upper electrode (410) may be the collector. The operation of the memristive transistor is then substantially similar to the conventional transistor described in FIGS. 2A and 2B. The base voltage is supplied via one or more of the right and left electrodes. This base voltage controls the thickness of the base/collector depletion zone, which in turn controls the amount of current which flows through the transistor.

Figure 5:
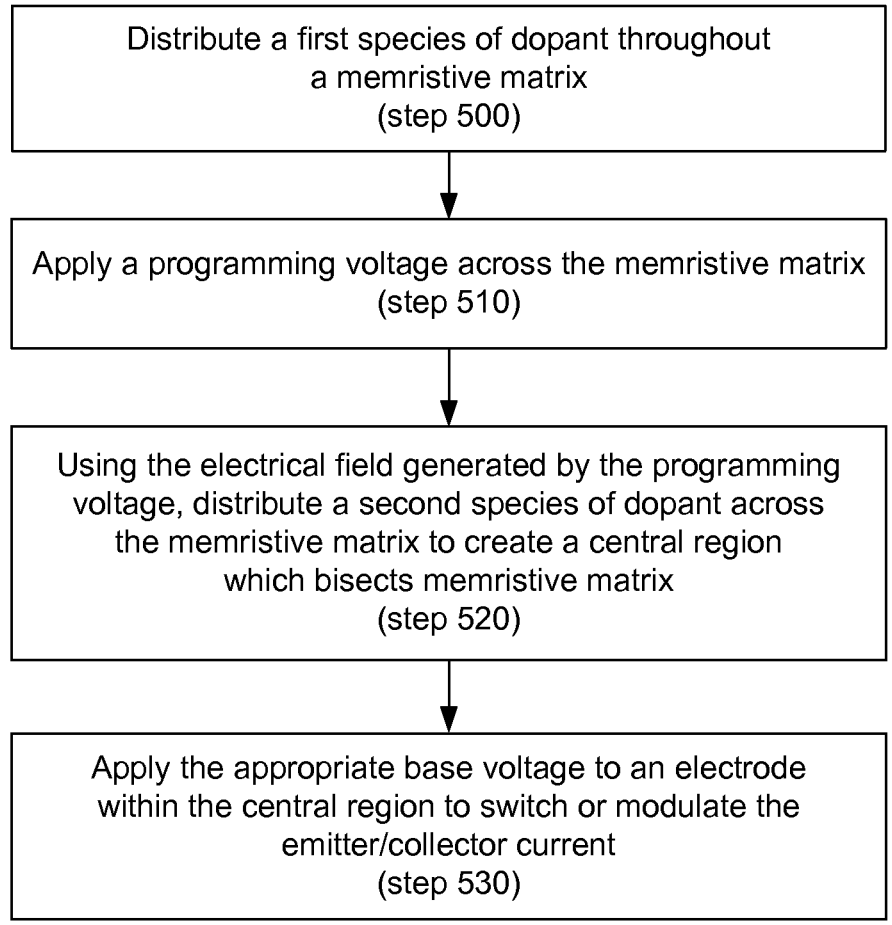
FIG. 5 is flowchart showing an illustrative method for using a multiplexing memristive device, according to one embodiment of principles described herein.

FIG. 5 is a flow chart which shows one illustrative method for configuring and using a memristive transistor. In a first step, a first species of dopant is distributed within a memristive matrix (step 500). This first species of dopant can be introduced and distributed in a variety of ways, including thermal diffusion, implantation, or dopant motion induced by an applied electrical field. In some illustrative embodiments, the first species of dopant may be placed within the memristive matrix during the manufacturing of the device, allowing the first step to be skipped. With a first species of dopants distributed within the memristive matrix, the memristive device is in a resistive configuration. In a second step, a programming electrical field is applied across the memristive matrix (step 510) which moves a second dopant species across the matrix (step 520). Three distinct layers are created within the matrix: two regions doped with the first dopant which are separated by a central region doped with the second dopant. This creates a bipolar transistor.

There are two fundamental dopant types: p-type dopants (electron acceptors) or n-type dopants (electron donors). The first dopant species can be either one of the two dopant types. The second dopant species will be the opposite dopant type. Consequently, the memristive transistor can be either an NPN or a PNP transistor.

The memristive transistor is then operated by the application of a base voltage to an electrode in contact with the central region (step 530). As discussed above, this base voltage changes the thickness of the base/collector depletion zone and allows for switching and amplification of the emitter to collector current.

In sum, a multi-electrode memristive device may operate in at least two different configurations. When a single mobile dopant is contained within the memristive matrix, the memristive device may switch or modulate electrical signals by moving dopants through the memristive matrix. By introducing another dopant with an opposite charge, the memristive device may be reconfigured to operate as a transistor device. This allows for rapid switching and modulation through the application of a control voltage rather than motion of dopants. The flexibility of the multi-electrode memristive device provides a number of advantages such as the ability to reconfigure electronic hardware, recover from system degradation, and optimize an electronic system's performance in a given situation. This flexibility can also provide the ability for the system to learn over time, apply fuzzy logic in hardware, and create hardware-based neural networks. The long term stability of the dopants within the memristive matrix allows the system to preserve its configuration and provide "instant on" operation.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:
1. A method of configuring a configurable memristive device comprising:
    a memristive matrix, said memristive matrix containing a first dopant species;
    an emitter electrode, a collector electrode, a programming electrode and a base electrode, said electrodes being in electrical contact with said memristive matrix; and a mobile dopant species different from the first dopant species, said method comprising: applying a programming electrical field between a pair of said electrodes to move said mobile dopant species within said memristive matrix while applying a second electrical field between another pair of said electrodes to control a shape of a distribution of said mobile dopant species within said memristive matrix.

2. The method of claim 1, wherein said first dopant species is also a mobile dopant species, said first dopant species moving within said memristive matrix in response to a programming electrical field.

3. The method of claim 2, wherein an electrical signal is regulated by repositioning said first dopant species.

4. The method of claim 1 wherein a programming voltage is applied to said memristive matrix such that said central region containing said mobile dopant species extends across said memristive matrix and divides said memristive matrix into two portions.

5. The method of claim 4, wherein said electrical signal is modulated by applying a control voltage to said base electrode such that a depletion zone between said central region and a region doped by said first dopant species is varied.

6. The method of claim 5, wherein said control voltage does not substantially reposition said mobile dopants.

7. The method of claim 1, wherein said memristive matrix is titanium dioxide.

8. The method of claim 7, wherein said first dopant is one of: an n-type dopant and a p-type dopant;
said n-type dopant comprises one of: oxygen vacancies and beryllium ions;
said p-type dopant comprises one of: magnesium ions and calcium ions.

9. The method of claim 1, wherein said mobile dopant is one of: an n-type dopant and a p-type dopant; and said mobile dopant having an opposite charge from said first dopant.

10. The method of claim 1, further comprising a reservoir, said reservoir containing said mobile dopant prior to application of said programming voltage.

11. The method of claim 1, further comprising, after applying said programming electrical field to position said mobile dopant species between said emitter and collector electrodes, applying a control voltage to said base electrode to regulate current flow between said emitter electrode and said collector electrode.

12. The method of claim 1, further comprising:
applying said programming electrical field between said base and programming electrodes; and
applying said second electrical field between said emitter and collector electrodes.

13. The method of claim 1, wherein said second electrical field is applied orthogonally to said programming electrical field.

14. A method of configuring a memristive device comprising:
applying a programming electrical field across a memristive matrix, said memristive matrix being doped with a first dopant, said memristive matrix being in electrical contact with an emitter electrode, a collector electrode, a base electrode and a programming electrode;
distributing a mobile dopant using said programming electrical field such that said mobile dopant forms a central doped region which divides into two portions said memristive matrix, wherein the mobile dopant is different from the first dopant; and
applying a second electrical field with two of said four electrodes to control a size of said central doped region.

15. The method of claim 14, further comprising tuning transistor characteristics of said memristive device by adjusting a distribution of at least one of said first dopant and said mobile dopant.

16. The method of claim 14, further comprising withdrawing said central doped region by applying a programming electrical field which moves said mobile dopants to one side of said memristive matrix.

17. The method of claim 14, further comprising removing said programming electrical field after said mobile dopants form said central doped region (360) which divides said memristive matrix into two portions; said mobile dopants remaining positionally stable within said memristive matrix until another programming electrical field is applied.

18. The method of claim 14, further comprising applying a control voltage to said base electrode to regulate current flow between said emitter electrode and said collector electrode.

19. The method of claim 14, further comprising applying said programming electrical field between said base and programming electrodes; and
applying said second electrical field between said emitter and collector electrodes.

20. The method of claim 14, wherein said second electrical field is applied orthogonally to said programming electrical field.

* * * * *

UNITED STATES PATENT AND TRADEMARK OFFICE
CERTIFICATE OF CORRECTION

PATENT NO.        : 8,787,064 B2
APPLICATION NO.   : 13/130805
DATED             : July 22, 2014
INVENTOR(S)       : Theodore I. Kamins et al.

It is certified that error appears in the above-identified patent and that said Letters Patent is hereby corrected as shown below:

In the Claims

In column 14, line 32, in Claim 17, after "region" delete "(360)".

Signed and Sealed this
Sixth Day of January, 2015

Michelle K. Lee
*Deputy Director of the United States Patent and Trademark Office*